US010489522B2

(12) United States Patent
Perrier et al.

(10) Patent No.: US 10,489,522 B2
(45) Date of Patent: Nov. 26, 2019

(54) METHOD OF CHECKING PRODUCIBILITY OF A COMPOSITE SECURITY DESIGN OF A SECURITY DOCUMENT ON A LINE OF PRODUCTION EQUIPMENT AND DIGITAL COMPUTER ENVIRONMENT FOR IMPLEMENTING THE SAME

(71) Applicant: KBA-NOTASYS SA, Lausanne (CH)

(72) Inventors: Jacques Perrier, Commugny (CH); Laurent Mathys, Plan-les-Ouates (CH)

(73) Assignee: KBA-NotaSys SA, Lausanne (CH)

( * ) Notice: Subject to any disclaimer, the term of this patent is extended or adjusted under 35 U.S.C. 154(b) by 1414 days.

(21) Appl. No.: 14/383,826

(22) PCT Filed: Mar. 6, 2013

(86) PCT No.: PCT/IB2013/051781
§ 371 (c)(1),
(2) Date: Sep. 8, 2014

(87) PCT Pub. No.: WO2013/132448
PCT Pub. Date: Sep. 12, 2013

(65) Prior Publication Data
US 2015/0088477 A1    Mar. 26, 2015

(30) Foreign Application Priority Data

Mar. 7, 2012 (EP) .................................... 12158372

(51) Int. Cl.
*G06F 17/50* (2006.01)
(52) U.S. Cl.
CPC ................. *G06F 17/5009* (2013.01)
(58) Field of Classification Search
CPC ...... G06F 17/5009; G06F 17/50; B41M 3/14; H04N 1/00005; H04N 1/00015;
(Continued)

(56) References Cited

U.S. PATENT DOCUMENTS 3,939,621 A    2/1976  Giori
4,045,944 A    9/1977  Giori
(Continued)

FOREIGN PATENT DOCUMENTS

CH            502 897          2/1971
DE    10 2004 045 169          3/2006
(Continued)

OTHER PUBLICATIONS

International Search Report for PCT/IB2013/051781 dated Jun. 3, 2013.
(Continued)

*Primary Examiner* — Doon Y Chow
*Assistant Examiner* — Kimberly L Jordan
(74) *Attorney, Agent, or Firm* — Nixon & Vanderhye P.C.

(57) ABSTRACT

There is described a method of checking producibility of a composite security design of a security document, in particular of a composite banknote design, on a line of production equipment, the composite security design being the product of a combination of multiple sets of design features that are to be provided on a substrate as a result of a plurality of successive production operations carried out by means of the line of production equipment. The method comprises the steps of (a) providing digital design data representative of the composite security design of the security document, (b) modelizing, in a computer environment, the line of production equipment by means of which the composite security design is intended to be produced, (c) performing a computer simulation of production results of the plurality of successive production operations on the basis of the digital design data and the modelized line of production equipment, and (d) evaluating the computer simulated production results and determining, on the basis of these computer simulated
(Continued)

production results, whether the composite security design can be produced on the line of production equipment.

14 Claims, 7 Drawing Sheets

(58) Field of Classification Search
CPC ........... H04N 1/00029; H04N 1/00034; H04N 1/00039; H04N 1/00047; H04N 1/0005; H04N 1/00074; H04N 1/233
See application file for complete search history.

(56) References Cited

U.S. PATENT DOCUMENTS

| | | | |
|---|---|---|---|
| 4,453,707 A | 6/1984 | Kühfuss | |
| 4,463,677 A | 8/1984 | Kuehfuss | |
| 4,516,496 A | 5/1985 | Giori | |
| 4,558,557 A | 12/1985 | Kuehfuss | |
| 5,062,359 A | 11/1991 | Giori | |
| 5,317,390 A | 5/1994 | Bolza-Schunemann et al. | |
| 5,363,320 A | 11/1994 | Boyle et al. | |
| 5,384,859 A | 1/1995 | Bolza-Schunemann et al. | |
| 5,521,722 A * | 5/1996 | Colvill | G06F 3/1208 101/211 |
| 5,626,005 A | 5/1997 | Klingelhoefer | |
| 5,671,671 A | 9/1997 | Wyssmann et al. | |
| 5,899,145 A | 5/1999 | Schaede | |
| 5,960,716 A | 10/1999 | Schaede | |
| 6,062,134 A | 5/2000 | Eitel et al. | |
| 6,101,939 A | 8/2000 | Giori et al. | |
| 6,109,172 A | 8/2000 | Wyssmann | |
| 6,112,651 A | 9/2000 | Eitel et al. | |
| 6,142,069 A | 11/2000 | Eitel et al. | |
| 6,182,959 B1 | 2/2001 | Eitel et al. | |
| 6,263,790 B1 | 7/2001 | Wyssmann et al. | |
| 7,011,020 B2 | 3/2006 | Dunninger et al. | |
| 7,434,727 B2 | 10/2008 | Bolognini | |
| 7,464,642 B2 | 12/2008 | Schaede | |
| 7,654,578 B2 | 2/2010 | Reinhart | |
| 7,806,051 B2 | 10/2010 | Schaede | |
| 7,922,858 B2 | 4/2011 | Eitel et al. | |
| 7,971,619 B2 | 7/2011 | Eitel et al. | |
| 8,006,970 B2 | 8/2011 | Sauer | |
| 8,065,957 B2 | 11/2011 | Scheade et al. | |
| 8,117,964 B2 | 2/2012 | Moreau | |
| 8,286,551 B2 | 10/2012 | Gygi | |
| 8,328,194 B2 | 12/2012 | Reinhard et al. | |
| 8,499,687 B2 | 8/2013 | Gygy et al. | |
| 8,499,690 B2 | 8/2013 | Schwitzky | |
| 8,516,960 B2 | 8/2013 | Bollettin et al. | |
| 8,528,477 B2 | 9/2013 | Schaede et al. | |
| 8,613,254 B2 | 12/2013 | Lohweg et al. | |
| 8,621,997 B2 | 1/2014 | Gygi | |
| 8,636,047 B2 | 1/2014 | Eitel et al. | |
| 8,696,856 B2 | 4/2014 | Eitel et al. | |
| 8,697,177 B2 | 4/2014 | Bolognini | |
| 8,726,805 B2 | 5/2014 | Stohr et al. | |
| 2001/0034592 A1 | 10/2001 | Herman | |
| 2002/0035450 A1 | 3/2002 | Thackston | |
| 2004/0117399 A1 | 6/2004 | Dittmar et al. | |
| 2004/0237816 A1 | 12/2004 | Dunninger et al. | |
| 2005/0154677 A1 | 7/2005 | Giori | |
| 2005/0246341 A1 | 11/2005 | Vuattoux et al. | |
| 2006/0144265 A1 | 7/2006 | Dunninger et al. | |
| 2006/0162591 A1 | 7/2006 | Schaede | |
| 2006/0208412 A1 | 9/2006 | Reinhard et al. | |
| 2006/0213384 A1 | 9/2006 | Reinhard et al. | |
| 2006/0219107 A1 | 10/2006 | Gygi | |
| 2006/0243146 A1 | 11/2006 | Scheade | |
| 2007/0012770 A1 | 1/2007 | Bolognini | |
| 2007/0094070 A1 * | 4/2007 | Curry | G06Q 10/00 358/1.15 |
| 2007/0181016 A1 | 8/2007 | Schaede | |
| 2007/0204755 A1 | 9/2007 | Moreau | |
| 2007/0211269 A1 | 9/2007 | Patrick et al. | |
| 2007/0222206 A1 | 9/2007 | Schaede et al. | |
| 2008/0130035 A1 | 6/2008 | Smith | |
| 2008/0137914 A1 | 6/2008 | Minhas | |
| 2008/0271620 A1 | 11/2008 | Hoier et al. | |
| 2008/0271854 A1 | 11/2008 | Eitel et al. | |
| 2008/0295724 A1 | 12/2008 | Lohweg et al. | |
| 2009/0003656 A1 | 1/2009 | Reinhard et al. | |
| 2009/0007807 A1 | 1/2009 | Schaede et al. | |
| 2009/0025594 A1 | 1/2009 | Schaede et al. | |
| 2009/0095178 A1 | 4/2009 | Schwitzky et al. | |
| 2009/0101030 A1 | 4/2009 | Stohr et al. | |
| 2009/0183644 A1 | 7/2009 | Bollettin et al. | |
| 2009/0243181 A1 | 10/2009 | Sauer | |
| 2009/0253114 A1 | 10/2009 | Herman et al. | |
| 2009/0254322 A1 | 10/2009 | Herman et al. | |
| 2010/0024511 A1 | 2/2010 | Eitel et al. | |
| 2010/0089261 A1 | 4/2010 | Schwitzky | |
| 2010/0170408 A1 | 7/2010 | Gygi et al. | |
| 2011/0017081 A1 | 1/2011 | Gygi | |
| 2011/0017393 A1 | 1/2011 | Eitel et al. | |
| 2011/0038701 A1 | 2/2011 | Sauer | |
| 2011/0139362 A1 | 6/2011 | Eitel et al. | |
| 2011/0146510 A1 | 6/2011 | Bolognini | |
| 2011/0259513 A1 | 10/2011 | Eitel et al. | |
| 2012/0266729 A1 | 10/2012 | Gygi et al. | |
| 2012/0312179 A1 | 12/2012 | Scheade et al. | |
| 2012/0312180 A1 | 12/2012 | Scheade et al. | |
| 2013/0112095 A1 | 5/2013 | Schaede et al. | |
| 2013/0176356 A1 | 7/2013 | Reinhard et al. | |
| 2013/0298791 A1 | 11/2013 | Gygi et al. | |
| 2014/0303949 A1 * | 10/2014 | Boneti | G06F 17/5009 703/6 |

FOREIGN PATENT DOCUMENTS

| | | |
|---|---|---|
| EP | 0 061 795 | 10/1982 |
| EP | 0 091 709 | 10/1983 |
| EP | 0 406 157 | 1/1991 |
| EP | 0 490 478 | 6/1992 |
| EP | 0 656 309 | 6/1995 |
| EP | 0 723 864 | 7/1996 |
| EP | 0 873 866 | 10/1998 |
| EP | 0 949 069 | 10/1999 |
| EP | 0 965 446 | 12/1999 |
| EP | 1 602 483 | 12/2005 |
| EP | 1 607 355 | 12/2005 |
| JP | 58-223600 | 12/1983 |
| JP | 2-18053 | 1/1990 |
| JP | 4-201450 | 7/1992 |
| JP | 5-503620 | 6/1993 |
| JP | 2000-501036 | 2/2000 |
| JP | 2003-44115 | 2/2003 |
| JP | 2008-312220 A | 12/2008 |
| JP | 2009-238102 | 10/2009 |
| JP | 2011-526567 | 10/2011 |
| KR | 1020050114612 A | 12/2005 |
| WO | WO 91/11877 | 8/1991 |
| WO | WO 97/18092 | 5/1997 |
| WO | WO 97/29912 | 8/1997 |
| WO | WO 97/34767 | 9/1997 |
| WO | WO 97/35721 | 10/1997 |
| WO | WO 97/35794 | 10/1997 |
| WO | WO 97/35795 | 10/1997 |
| WO | WO 97/36756 | 10/1997 |
| WO | WO 03/047862 | 6/2003 |
| WO | WO 03/099579 | 12/2003 |
| WO | WO 2004/069538 | 8/2004 |
| WO | WO 2004/069539 | 8/2004 |
| WO | WO 2004/096545 | 11/2004 |
| WO | WO 2004/101282 | 11/2004 |
| WO | WO 2005/000585 | 1/2005 |
| WO | WO 2005/008605 | 1/2005 |
| WO | WO 2005/008606 | 1/2005 |
| WO | WO 2005/077656 | 8/2005 |
| WO | WO 2005/090088 | 9/2005 |
| WO | WO 2005/102728 | 11/2005 |
| WO | WO 2005/102733 | 11/2005 |
| WO | WO 2005/118294 | 12/2005 |

(56) References Cited

FOREIGN PATENT DOCUMENTS

| WO | WO 2005/123415 | 12/2005 |
|---|---|---|
| WO | WO 2006/032375 | 3/2006 |
| WO | WO 2006/129245 | 12/2006 |
| WO | WO 2007/042919 | 4/2007 |
| WO | WO 2007/060615 | 5/2007 |
| WO | WO 2007/060624 | 5/2007 |
| WO | WO 2007/105059 | 9/2007 |
| WO | WO 2007/105061 | 9/2007 |
| WO | WO 2007/116353 | 10/2007 |
| WO | WO 2008/010125 | 1/2008 |
| WO | WO 2008/099330 | 8/2008 |
| WO | WO 2008/102303 | 8/2008 |
| WO | WO 2008/104904 | 9/2008 |
| WO | WO 2009/112989 | 9/2009 |
| WO | WO 2009/130638 | 10/2009 |
| WO | WO 2010/001317 | 1/2010 |
| WO | WO 2010/023598 | 3/2010 |
| WO | WO 2011/015982 | 2/2011 |
| WO | WO 2011/077348 | 6/2011 |
| WO | WO 2011/077350 | 6/2011 |
| WO | WO 2011/077351 | 6/2011 |

OTHER PUBLICATIONS

Written Opinion of the International Searching Authority dated Jun. 3, 2013.

* cited by examiner

Fig. 7

METHOD OF CHECKING PRODUCIBILITY OF A COMPOSITE SECURITY DESIGN OF A SECURITY DOCUMENT ON A LINE OF PRODUCTION EQUIPMENT AND DIGITAL COMPUTER ENVIRONMENT FOR IMPLEMENTING THE SAME

This application is the U.S. national phase of International Application No. PCT/IB2013/051781 filed 6 Mar. 2013 which designated the U.S. and claims priority to EP 12158372.8 filed 7 Mar. 2012, the entire contents of each of which are hereby incorporated by reference.

PREAMBLE/TECHNICAL FIELD

The present invention generally relates to a method of checking producibility of a composite security design of a security document, in particular of a composite banknote design, on a line of production equipment, the composite security design being the product of a combination of multiple sets of design features that are to be provided on a substrate as a result of a plurality of successive production operations carried out by means of the line of production equipment. The invention also relates to a digital computer environment for implementing this method.

BACKGROUND OF THE INVENTION

U.S. Pat. No. 5,521,722, the content of which is incorporated herein by reference in its entirety, discloses an apparatus for handling digital representations of security documents, in particular of banknotes, which apparatus is intended to facilitate computer-aided design and manufacture of such security documents. According to U.S. Pat. No. 5,521,722, individual sets of design features (referred to as "layers") making up the composite security design of the security document are stored as individual digital images made of pixels which can be overlaid to build a composite image of the composite security design of the security document. More precisely, U.S. Pat. No. 5,521,722 teaches to store image content and colour content of each relevant "layer" in separate memories and provides an elaborate, but complex, colour generator for generating colour data defining, independently of the image content data, the colour of each pixel of each image or combination of images of the relevant "layers". A processor selectively combines the image content data and the generated colour data to enable selected images to be viewed separately or in combination, in particular for colour proofing purposes.

The layering structure of U.S. Pat. No. 5,521,722 allows for an individual definition (and modification as the case may be) of each relevant "layer", i.e. each set of design features is defined in an independent manner, thereby facilitating edition or modification of any "layer" if desired. Measures are further contemplated to provide production tolerance parameters such that the designer can view a particular document when "layers" move laterally within tolerance bands. This is achieved by causing the specified image (or images) to be displaced relative to one another. This ability is however limited to simple translational movements of one image or "layer" with respect to another. While this solution may replicate possible mis-registration of design features which are inherent to the production of security documents, such replication is however not properly reflecting the actual variations which can be encountered in practice during the production of security documents.

German Patent Publication No. DE 10 2004 045 169 A1 (which corresponds to International Patent Publication No. WO 2006/032375 A2) discloses a method for the layout and checking of value documents, in particular banknotes. According to this method, a design of the value document is generated by means of a CAD system, which design comprises several features that are described by CAD data. Such CAD data, which is representative of the design of the value document, is checked as to the suitability of the features for an automatic checking, i.e. by means of a processing machine equipped with sensors designed to check the relevant features. In other words, this method is directed to the appropriate design of machine-readable feature which can suitably be detected by automatic processing machines. This method is based exclusively on the CAD data describing the relevant features of the design of the value document, but does not as such replicate or take into account the actual variations which occur in practice during the actual production of security documents.

SUMMARY OF THE INVENTION

A general aim of the invention is to provide an improved solution enabling an operator, such as but not exclusively a security designer, to efficiently and reliably check if a composite security design is producible on any particular line of production equipment.

In particular, a more specific aim of the invention is to provide such a solution which allows the operator to efficiently and reliably model and replicate expected results of the production, on any particular line of production equipment, of any given composite security design of a security document, prior to actual production of the security document.

Even more specifically, an aim of the invention is to provide such a solution that allows the operator to anticipate and/or identify, prior to actual production of the security document, possible issues that affect or may affect the ability of any given composite security design to be produced on any particular line of production equipment, which issues may result from the design choices made during design of the composite security design and/or from production-related constraints or limitations that depend on the actual specifications of the line of production equipment intended to be used to produce the composite security design.

These aims are achieved thanks to the method and digital computer environment as defined in the appended claims.

In accordance with the invention, evaluation of the producibility of a composite security design of a security document, in particular of a banknote design, on a line of production equipment is performed in a digital computer environment, prior to actual production of the security document, it being specified that the composite security design is the product of a combination of multiple sets of design features that are to be provided on a substrate as a result of a plurality of successive printing or processing operations (or "production operations") carried out by means of the line of production equipment. According to the invention, digital design data representative of the composite security design of the security document are provided and the particular line of production equipment by means of which the composite security design is intended to be produced is modelized in a computer environment, there being performed a computer simulation of production results of the plurality of successive production operations on the basis of the digital design data and the modelized line of production equipment. Thanks to this computer simulation, the operator can evaluate the simulated production results and determine, on the basis of these simulated production results, whether the composite security design is producible (i.e. can be produced) on that particular line of production equipment.

Thanks to the invention, the operator can anticipate and potentially identify issues related to the design and/or issues due to inherent technical constraints or limitations of the particular line of production equipment that is intended to be used to produce the composite security design. If such issues are highlighted by the simulation, corrective actions and measures can be taken. In addition, thanks to the invention, the operator can further assess in which respect the composite security design is sensitive to varying production conditions.

In an advantageous embodiment, the digital design data can be edited on the basis of the computer simulated production results to match a production capability of the particular line of production equipment. Likewise, a production machine, or a component thereof, within the line of production equipment that prevents or otherwise affects the ability of the particular line of production equipment to produce the composite security design can be identified.

In a preferred embodiment where the digital design data representative of the composite security design include multiple digital design data sets each representing a corresponding one of the multiple sets of design features forming the composite security design, the computer simulation includes a step-by-step computer simulation of the successive production operations including, for each one of the plurality of successive production operations, the generation of a corresponding series of digital representations of computer simulated production results of that production operation, which series of digital representations simulates expected variations and fluctuations in the provision of the relevant set of design features. Such fluctuations are in particular the result of inherent production variations, including inter alia variations regarding the positioning, orientation and geometry of printing plates, variations in the inking, inherent geometric distortions of the paper substrate, etc.

By such measures, evaluation and validation of the producibility of the composite security design on the line of production equipment is ensured, step-by-step, which greatly limits the risk that design-related and/or production-related issues may only arise or be identified during actual production of the security document.

In a variant of this preferred embodiment where the security document is produced in the form of a substrate carrying a composite impression consisting of the replication of the composite security design of the security document according to an array of multiple rows and columns, the computer simulation includes the generation of a series of digital representations of computer simulated production results of the whole composite impression, which series of digital representations simulates expected variations and fluctuations in the provision of the relevant set of design features over the entire area of the composite impression. This in particular allows for an evaluation of the composite security design over the entire surface of the composite impression (e.g. the entire surface of a printed sheet), it being to be appreciated that the composition impression exhibits variations and fluctuations in the provision of the relevant set of design features from one row or column to the other.

In this context, it may be advantageous to further perform a computer simulation of control marks provided in margin portions of the printed substrate, i.e. outside of the area of the composite impression. Such control marks may in particular include (this being a non-exhaustive list of possible control marks) print-to-print register marks indicative of a register between successive impressions (such as register between an offset impression and an intaglio impression), plate-to-plate register marks indicative of the register between different printing plates (such as register between various offset printing plates), or cutting marks indicative of positions at which the printed substrate is to be cut during a finishing operation (i.e. an operation where substrates are typically cut along the rows and columns of the composite impression).

Preferably, the computer simulation includes performing a computer simulation of the production results within at least one region of interest of the composite security design covering only a portion of the surface of the security document. For instance, the computer simulation could be limited to a localized region covering any particular security feature or pattern that is of interest, such as the area of a portrait or like pictorial representation, the area of any particular printed security feature consisting of a combination of multiple impressions, the area of a serial number, etc. In that context, only the relevant production operations that effectively affect the region of interest under consideration need to be simulated, it being noted that all production operations do not necessarily affect the entire surface covered by the composite security design.

Considering that the nature of the substrate and of features thereof (such as watermarks, security threads, windows and like substrate-embedded features) can also affect the resulting appearance of the composite security design, it is advantageous in a further embodiment of the invention that the computer simulation also includes a computer simulation of the substrate and of its features as well as of expected geometric distortions of the substrate occurring during production.

In yet another embodiment of the invention, the modelization of the particular line of production equipment includes a modelization of each production machine composing that line of production equipment. Advantageously, and considering that each particular line of production equipment may be different and exhibit a particular configuration and varying specifications, a library of modelized production machines susceptible of composing a line of production equipment is predefined and the modelization includes building a modelized line of production equipment based on the said library.

In a further advantageous embodiment, the computer simulation includes performing a computer simulation of production results under different simulated viewing or reading conditions. Such conditions in particular include reflected visible light simulating a visible optical appearance (i.e. under visible light) of the composite security design as viewed under reflected visible light from one side (or the other) of the security document or transmissive visible light simulating an optical appearance of the composite security design as viewed in transmission through the security document. This latter viewing condition in particular enables to simulate the recto-verso register between the impressions on both sides of a security document, which recto-verso register is in particular exploited in the field of banknote printing to create so-called see-through security features. An additional simulated viewing condition includes invisible illumination simulating a visible optical appearance of the composite security design resulting from illumination by invisible or near-visible light, such as ultraviolet light (i.e. radiation of a wavelength ranging between approximately 250 to 400 nm) or infrared light (i.e. radiation of a wavelength exceeding approximately 750 nm), it being noted that many security features used in the art of security printing are for instance based on materials that are responsive to illumination in the ultraviolet (or near-ultraviolet) spectrum or infrared (or near-infrared) spectrum. Yet an additional reading condition being advantageously simulated is machine-reading simulating a machine-readable appearance of the composite security design as detectable by a machine when subjected to a machine detection technique. Such a machine detection technique may in particular be magnetic reading whereby magnetic properties are read by a suitable detecting device or detection in the invisible light spectrum, such as in the infrared or ultraviolet spectrum.

In yet another embodiment of the invention, the computer simulated production results can further be exploited for the purpose of generating a reference model for inspection of the production quality of the composite security design during production. Nowadays, reference models for inspection are typically "learned" by the relevant inspection systems, i.e. a set of printed sheets considered to be meeting desired quality requirements are fed through the inspection systems and images thereof are acquired and processed in order to build the reference models (see e.g. U.S. Pat. Nos. 5,317,390 and 5,384,859). Thanks to the invention, the computer simulated production results can facilitate or provide assistance in the creation of such reference models.

A suitable digital computer environment for implementing the above method comprises a computer system running a software program designed to allow an operator to check the producibility of the composite security design, the software program being designed to carry out the following operations:
  processing of digital design data representative of the composite security design of the security document;
  modelization of the line of production equipment by means of which the composite security design is intended to be produced; and
  running of a computer simulation of production results of the plurality of successive production operations on the basis of the digital design data and the modelized line of production equipment.

Advantageous embodiments of the above objects form the subject-matter of the dependent claims.

BRIEF DESCRIPTION OF THE DRAWINGS

Other features and advantages of the present invention will appear more clearly from reading the following detailed description of embodiments of the invention which are presented solely by way of non-restrictive examples and illustrated by the attached drawings in which.

DETAILED DESCRIPTION OF EMBODIMENTS OF THE INVENTION

In the context of the present invention, the expression "composite security design" is to be understood as referring to the product of the combination of multiple sets of design features that are to be provided on a substrate as a result of a plurality of successive operations (or "production operations"). Banknotes, in particular, are produced as a result of a plurality of successive production operations typically including several printing operations (in particular offset printing, screen printing, intaglio printing and typographic printing), processing operations (in particular foil application, marking, such as laser marking, perforation, and cutting operations, such as the cutting of windows into substrates), as well as finishing operations whereby fully-printed substrates carrying multiple security prints are typically cut and processed into individual security documents. A composite security design as presently defined is to be distinguished from designs that are printable by means of digital printers or by means of conventional offset printing equipment, which printers and equipment are merely able to print multicolours patterns, but cannot replicate the high complexity of the composite security designs that typically result from the combination of the aforementioned production operations applied in security printing. In the context of the instant invention, the expression "design features" in particular means any security feature that can be printed or otherwise provided on a substrate, and may further encompass security features that are already provided on or embedded into the substrate material onto which further design features are to be printed or otherwise provided, such as watermarks, security threads, planchettes, windows, iridescent markings and like substrate-embedded features.

Figure 1:
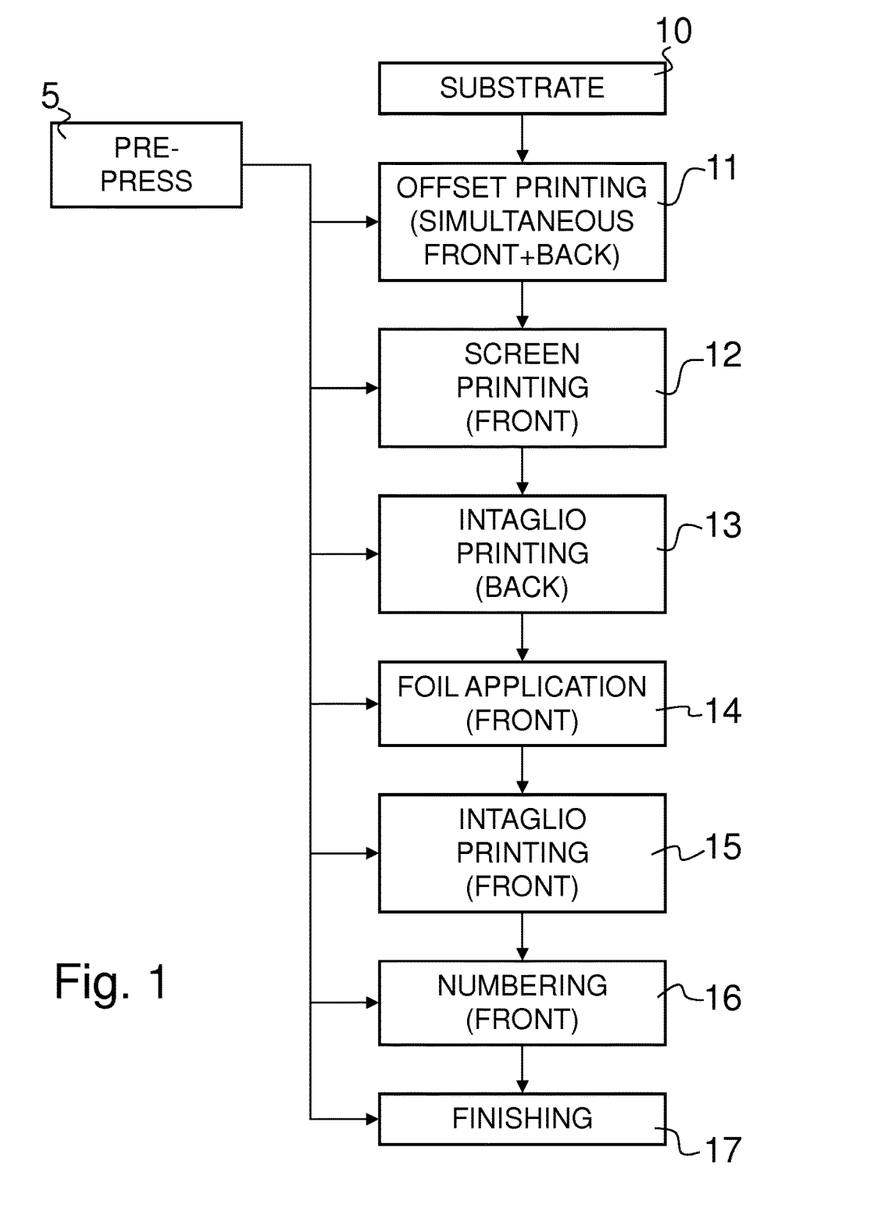
FIG. 1 is a schematic flow chart illustrating a non-limiting example of a sequence of printing and processing operations that are typically carried out in the art of banknote production.

FIG. 1 is a schematic flow chart illustrating a non-limiting example of a sequence of printing and processing operations that are typically carried out in the art of banknote production. In essence, the life of a banknote starts with the generation of an adequate banknote design, which task is handled by a security designer or team of security designers and is schematically depicted in FIG. 1 under the designation "PRE-PRESS" and designated by reference numeral 5. The designer's main objective is to make maximum use of all the possibilities offered by the various banknote printing processes so as to obtain the most constant and the highest quality print results. It is typically the marriage and interplay between various design features, and not necessarily any single isolated feature, that guarantees the overall security of a banknote (or like security document).

The pre-press activities typically encompass two major tasks. The first major pre-press task is the design, proof, management and output of an appropriate composite banknote design which, as already mentioned, consists of a composition and combination of multiple sets of design features. Nowadays, such first task is typically carried out in a digital computer environment by means of a fully integrated digital design and assembly system, such as the ONE® high security prepress system for banknote design as marketed by the present Applicant. Thanks to such a prepress system, designers can design, proof, manage and output security document data from beginning to end in one integrated workflow. In essence, this first task involves the generation of digital design data representative of the composite security design of the desired security document, which digital design data include multiple digital design data sets each representing a corresponding one of the multiple sets of design features forming the composite security design.

The second major pre-press task is the appropriate generation and origination of all printing plates and related printing media required to perform actual production of the security document. Nowadays, CTP (Computer To Plate) systems are used which allow for a more or less direct transposition of the digital design data sets generated by the designers into the required printing plates and like printing media. In the context of high security printing, such CTP systems are for instance available for the transposition of digital offset designs to a laser plate-making device, which equipment is marketed by the Applicant under the designation CToP® (Computer To Offset Plate). Similarly, CTP systems for the transposition of digital intaglio designs into a full sheet-format master plate for intaglio printing (whether for galvanic plate origination and reproduction or directly for printing) are marketed by the Applicant under the designations CTiP® (Computer To Intaglio Plate) and CTiP® Direct.

In summary, pre-press activities involve the generation of digital design data of the relevant design features and the origination of the required printing plates and related printing media necessary to provide such design features on a substrate at corresponding steps of the production of a security document. Referring again to the non-limiting example of FIG. 1, such production starts at 10 with the provision of a desired substrate material which is processed through a succession of production operations 11 to 17 including, in this non-limiting example:

- an offset printing operation (reference numeral 11) which is preferably performed simultaneously on the front and back of the substrate using a so-called "Simultan" offset printing press (see e.g. FIG. 4) which is only used in the security printing industry;
- a screen printing operation (reference numeral 12) which is normally carried out on one side of the substrate only (such as on the front side);
- a first intaglio printing operation (reference numeral 13) which is normally carried out on a back side of the substrate using an intaglio printing press (see e.g. FIG. 5);
- a foil application operation (reference numeral 14) which typically consists of the application by means e.g. of a hot-stamping press of foil material onto the surface of the substrate (here on the front side);
- a second intaglio printing operation (reference numeral 15) which is carried out in this example on a front side of the substrate;
- a numbering operation (reference numeral 16) which is typically carried out by typographic printing (also referred to as letterpress printing) or by any other suitable numbering technique, such as by laser marking; and
- a finishing operation (reference numeral 17) which consists in the stacking, cutting, banderoling and packing of fully-printed substrates into individual security documents.

All banknotes and like security documents are not necessarily produced according to the flow chart of FIG. 1 and variations are obviously possible. It is to be understood however that each production operation has its own production characteristics (or properties) and that variations and fluctuations in the produced results will necessarily occur as the substrate is processed through each production step. Such production variations are due to various factors, including differences in the production of the printing plates and related printing media, but also to differences in the manner in which each printing or processing operation is carried out and which depend especially on the particular specifications of the printing or processing equipment used to carry out such operations. In addition, the substrate material inevitably undergoes geometric distortions during and/or as a result of the various printing or processing operations.

It is therefore to be appreciated that all banknotes (and like security documents) of a given design are not strictly identical, but exhibit overall production-related variations and fluctuations that cannot be avoided and that are accepted. It is of crucial importance however that such variations and fluctuations are kept under control and do not visibly affect the overall appearance of the final composite security design, nor the level of security of the security document.

Figure 2:
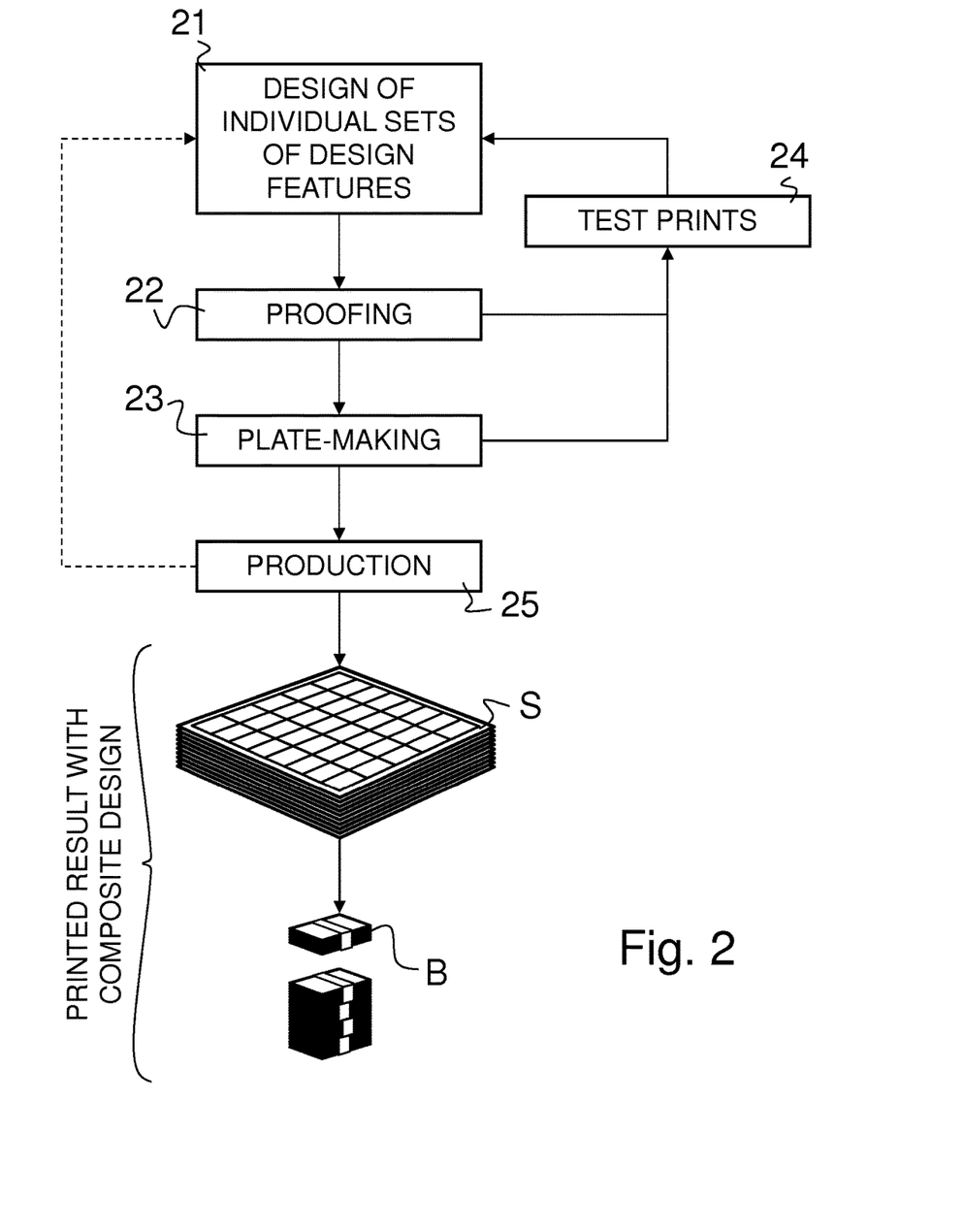
FIG. 2 is a schematic diagram illustrating a typical banknote production cycle, from the design work to actual production of printed sheets and individual banknotes.

In the art of banknote design, it is typical, once individual sets of design features have been designed, to undertake proofing and test prints of the generated sets of design features to control how such design features combine together. This typically requires, as schematically illustrated by FIG. 2, proofing operations 22 based on the digital design data generated at 21 and production of corresponding printing media at 23, as well as test prints at 24. Such test prints at 24 typically including both digital test prints—which do not require the production of any particular printing medium—and actual tests prints using proofing printing media that closely replicate the actual printing media to be used during actual production—in which case corresponding printing media need to be produced at 23. This typically involves an iterative process whereby the digital design data are edited or modified based on the result of proofing and/or of the test prints.

Once this process is completed, printing media (including but not limited to printing plates) can be manufactured at 23 for actual production at 25, which results in the production of corresponding sheets S of security documents and, ultimately, of individual security documents, e.g. individual banknotes B. As the production of banknotes and like security documents is not an exact science, issues may arise during actual production of the security documents, in which case the digital design data may need to be corrected and new printing plates originated for production.

Figure 3:
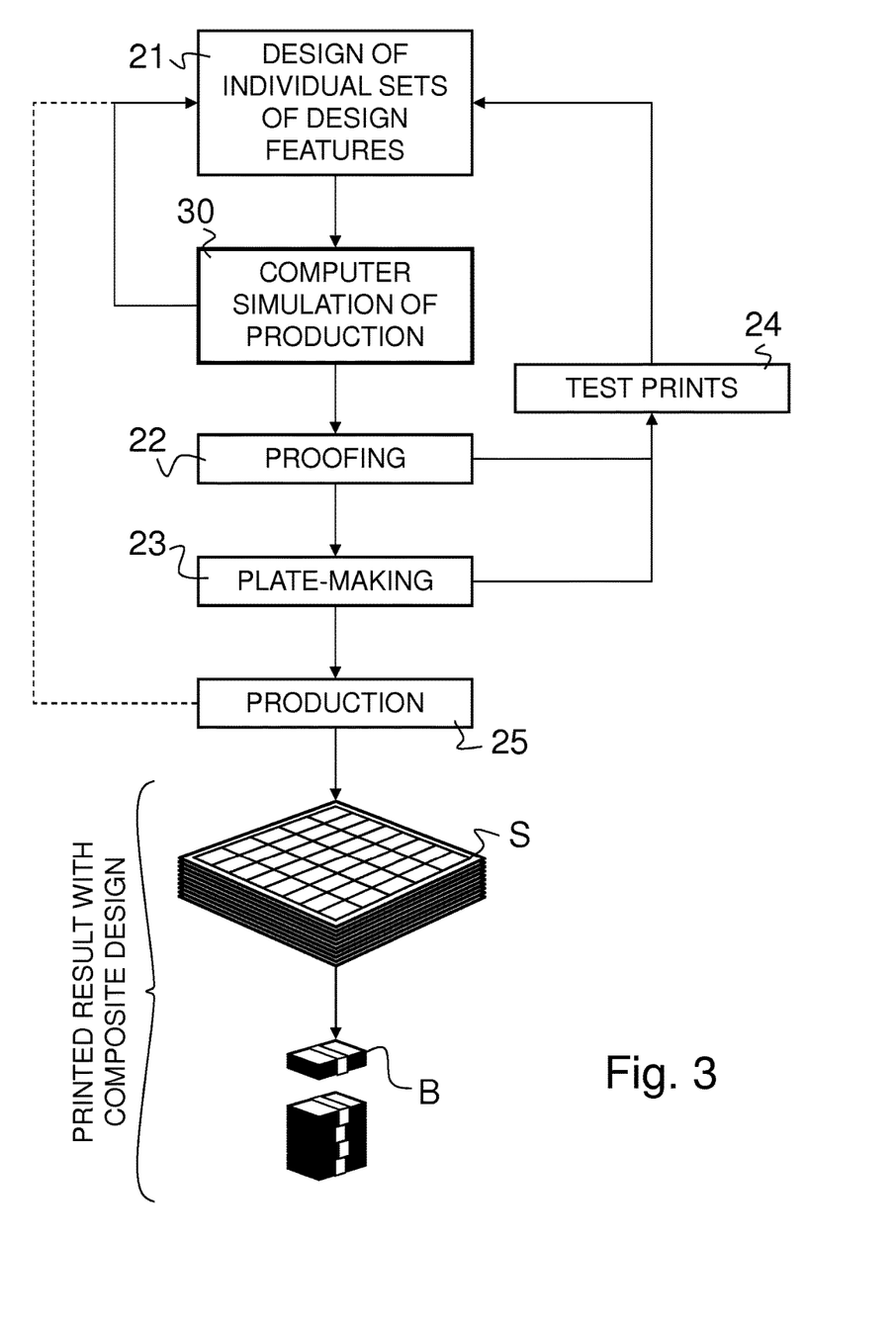
FIG. 3 is a schematic diagram illustrating a banknote production cycle according to the invention implementing, before actual production of the security documents, a computer simulation of the production of the desired composite security design.

FIG. 3 schematically illustrates the context in which the present invention may be applied. As compared to the process illustrated in FIG. 2, the overall process as depicted in FIG. 3 remains essentially the same, except that the invention provides for an additional operation consisting in a computer simulation 30 of the production of the composite security design prior to actual plate-making and printing. In FIG. 3, such computer simulation 30 is carried out before proofing at 22. It is however to be appreciated that this may not necessarily be the case and that proofing could alternatively be carried out before or in parallel to the simulation 30.

As this will be appreciated, the computer simulation 30 allows for a direct feedback to be given to the operator as regards the expected producibility of the particular composite security design on the desired line of production equipment, which feedback may allow the operator to adapt the design (as schematically depicted in FIG. 3) and/or identify potential limitations or bottlenecks in the line of production equipment which may require technical changes or updates in the production equipment in order to be able to suitably produce the desired composite security design.

Figure 4:
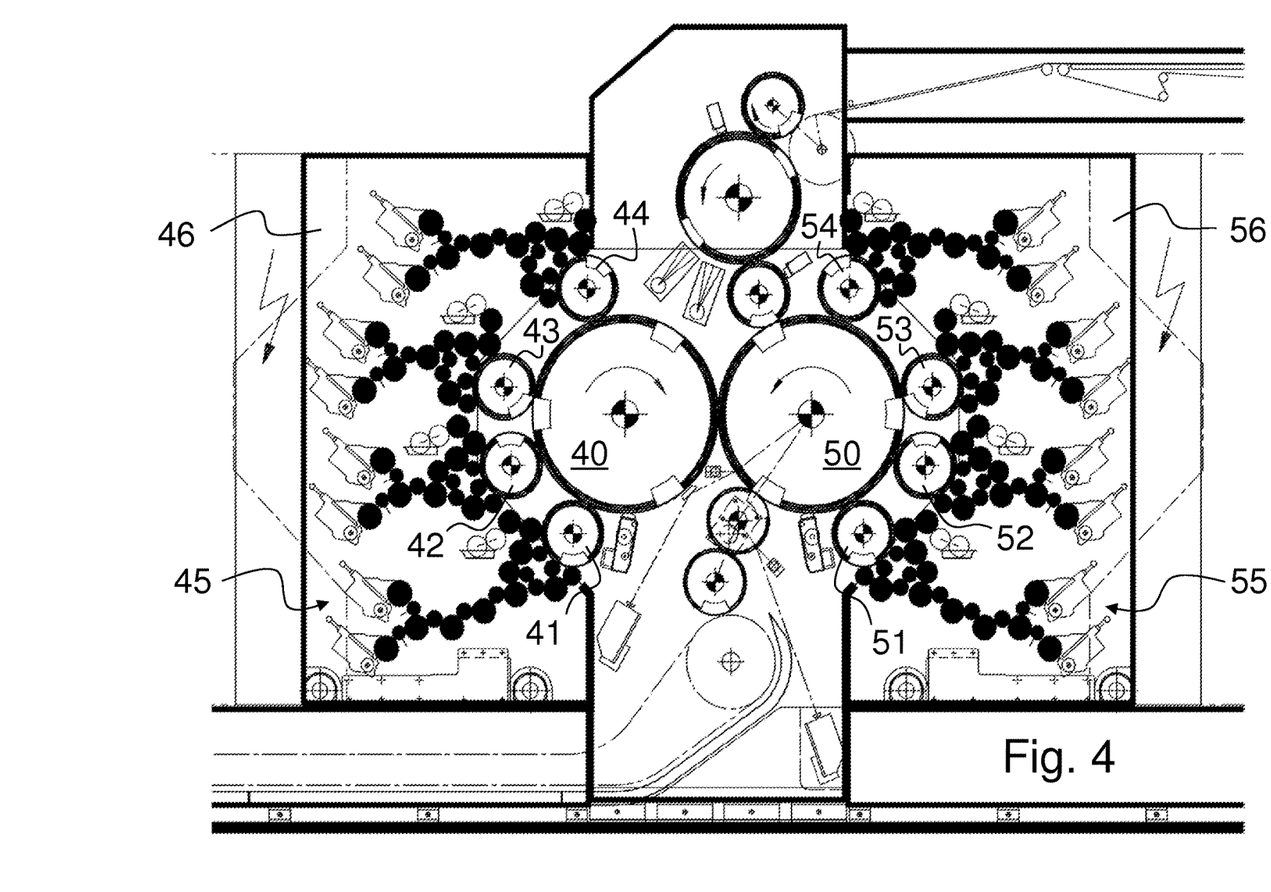
FIG. 4 is a schematic partial side view of a known offset printing press for the simultaneous recto-verso printing of sheets as used for the production of security documents.

FIG. 4 is a schematic partial side view of a known Simultan-type offset printing press for the simultaneous recto-verso printing of individual sheets, as typically used in the art of security printing and marketed by the Applicant under the product designation Super Simultan®. In the illustrated example, the offset printing press comprises a main printing group including two blanket cylinders 40, 50 between which the sheets to be printed are transported, simultaneous recto-verso printing of the sheets occurring at the printing nip between the two blanket cylinders 40, 50. In this example, the two blanket cylinders 40, 50 are three-segment cylinders. Individual sheets are fed from a sheet feeder (not illustrated) at the top of the printing press to the blanket cylinder 50 via a swing-gripper system and three successive sheet transfer cylinders or drums (not referenced in FIG. 4), the blanket cylinder 50 transporting the sheets in succession to and past the printing nip. One of the sheet transfer cylinders upstream of the blanket cylinder 50, namely the two-segment cylinder in FIG. 4, can also act as impression or blanket cylinder for an additional printing group as taught for instance by European Patent Publication No. EP 0 949 069 A1 and International Publication No. WO 2007/042919 A2, both assigned to the instant Applicant. Once printed at the printing nip between the blanket cylinders 40, 50, the freshly printed sheet are transported to a sheet delivery station (not illustrated), in this example via a pair of intermediate sheet transfer drums and a conventional sheet conveyance system comprising a pair of endless chains driving spaced apart gripper bars (not referenced).

In the illustration of FIG. 4, each blanket cylinder 40, 50 receives and collects multicolour ink patterns from corresponding plate cylinders 41 to 44 and 51 to 54 each carrying a single wet-offset or dry-offset printing plate. In this particular example, it shall therefore be understood that four printing plates P1 to P4, respectively P5 to P8 are provided for printing of each side of the sheets. This printing press is often referred to as an eight-colour or 4+4-colour Simultan offset printing press. This being said, more than one ink colour may be applied onto each printing plate P1-P8, it being noted that each printing plate P1-P8 is inked by a corresponding inking system 45, respectively 55, with individual inking units (each inking system 45, 55 being located in a corresponding mobile inking carriage 46, 56). More precisely, each inking units comprises two separate ink fountains feeding ink to a corresponding ink train comprising multiple ink rollers as shown. Two different inks in each inking unit are in particular used in the case of iris printing whereby the two different inks are partially and gradually mixed transversely to the path of the sheets by oscillating one or more of the ink rollers of the ink train, thereby leading to a gradual transition of one ink to the other ink transversely to the path of the sheets. So-called two-dimensional iris printing is also possible as disclosed in International Publication No. WO 2008/099330 A2.

Printing of sheets using the offset printing press of FIG. 4 (or like Simultan offset printing presses) is inherently affected by production variations, in particular variations that relate to the inherent production of the offset printing plates per se, but also variations which depend on the actual specifications of the particular offset printing press being used, such as in respect of the mounting, clamping and positioning of the printing plates on the corresponding plate cylinders. Taking the illustration of FIG. 4 as example, such variations will mainly impact the register between the various ink patterns collected by the blanket cylinders 40, 50 and therefore the resulting print on the sheets, both in terms of the so-called plate-to-plate register, but also in terms of the actual print register over the entire sheet. These variations will also impact the recto-verso register between the print on the front side and the print on the back side. The so-called line-gain which is representative of the increase in line width of the offset-printed features compared to the actual line width of the printing features on the printing plate is a further factor that is to be taken into account. Other factors like geometric sheet distortions occurring during or as a result of the offset printing operation should furthermore be taken into account.

Figure 5:
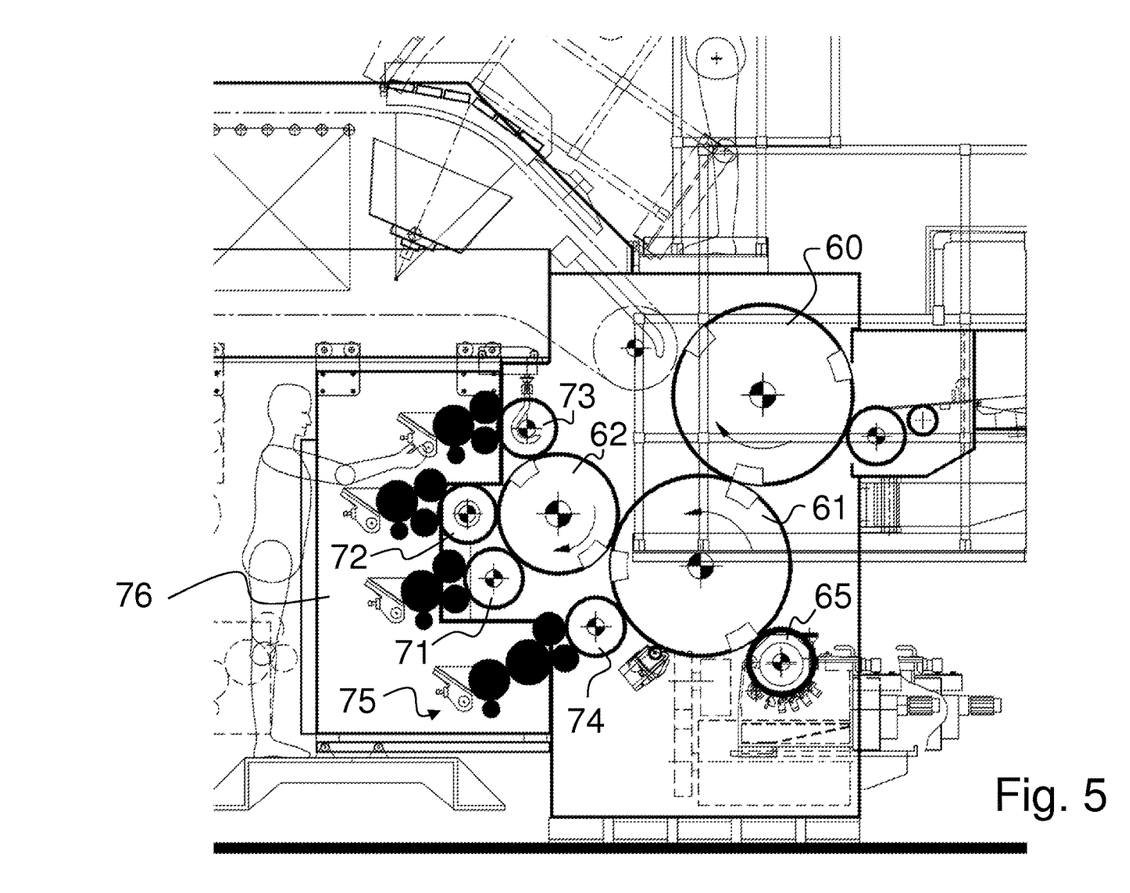
FIG. 5 is a schematic partial side view of a known intaglio printing press for the single-sided printing of sheets as used for the production of security documents.

FIG. 5 is a schematic partial side view of a known intaglio printing press for the single-sided printing of individual sheets, as typically used in the art of security printing and marketed by the Applicant under the product designation Super Orlof Intaglio®. In the illustrated example, the intaglio printing press comprises a main printing group including an impression cylinder 60 and a plate cylinder 61, cooperating with the impression cylinder 60, between which the sheets to be printed are transported, intaglio printing of the sheets occurring at the printing nip between the impression cylinder 60 and the plate cylinder 61. In this example, the impression cylinder 60 and the plate cylinder 61 are three-segment cylinders (the plate cylinder 61 thus being designed to carry three intaglio printing plates IP1, IP2 and IP3). Individual sheets are fed from a sheet feeder (not illustrated) to the impression cylinder 60 which transports each sheet in succession via and past the printing nip. Once printed at the printing nip between the cylinders 60, 61, the freshly printed sheet are transported to a sheet delivery station (not illustrated), in this example via a conventional sheet conveyance system comprising a pair of endless chains driving spaced apart gripper bars (not referenced).

In the illustration of FIG. 5, the plate cylinder is inked by an inking system 62, 71-76 comprising a two-segment ink-collecting (or Orlof) cylinder 62 which collects a multicolour ink pattern from three corresponding chablon cylinders 71 to 73 each carrying a single chablon plate CP1 to CP3. In this example, a fourth chablon cylinder 74 carrying a fourth chablon plate CP4 directly inks the plate cylinder 61. The four chablon cylinders 71 to 74 with their respective chablon plate CP1 to CP4 are inked by a corresponding inking system 75 with individual inking units (the inking system 75 being located in a corresponding mobile inking carriage 76). As is typical in the art of intaglio printing, a wiping unit comprising a wiping cylinder 65 is provided in order to wipe excess ink from the surface of the intaglio printing plates IP1, IP2, IP3 (such wiping unit being located downstream of the location where the inks are applied and upstream of the printing nip location). This printing press is often referred to as an four-colour or 3+1-colour intaglio printing press, with three so-called "indirect colours" and one "direct colour". This being said, more than one ink colour may be applied onto each chablon plate CP1 to CP4. It this particular example, while a single ink fountain per chablon cylinder 71-74 is provided to supply ink, ink separators could be used in each fountain to allow for the application of more than one ink in corresponding annular sections of the chablon plates CP1-CP4 and intaglio printing plates IP1-IP3.

Printing of sheets using the intaglio printing press of FIG. 5 (or like intaglio printing presses) is inherently affected by production variations, in particular variations that relate to the inherent production of the intaglio printing plates and chablon plates per se, but also variations depending on the actual specifications of the particular intaglio printing press, such as in respect of the mounting, clamping and positioning of the chablon and intaglio printing plates on the corresponding cylinders. Taking the illustration of FIG. 5 as example, such variations will mainly impact the register between the various ink patterns collected by the ink-collecting cylinder 62, the relative register of the ink colours as transferred onto the intaglio printing plates IP1-IP3 by the ink-collecting cylinder 62 and the fourth chablon cylinder 74, the overall print register defined by each individual intaglio printing plate IP1-IP3, and therefore the resulting print on the sheets. Other factors like variations of the wiping as well as geometric sheet distortions occurring during or as a result of the intaglio printing operation (which geometric sheet distortions are inevitable in the case of intaglio printing due to the typically high printing pressures being applied) should furthermore be taken into account.

It shall be understood that all printing presses, such as the above mentioned offset and intaglio printing presses, do not necessarily exhibit the same configuration, the same specifications and/or the same production variations, but that variations from one printing press to another are necessarily present and to be expected. This equally applies to any other production equipment susceptible of being used in the context of the production of any composite security design.

In the context of the present invention, the computer simulation of each production operation (including the above described offset and intaglio printing operations) is therefore designed to take due account of the relevant configuration, production variations and specifications of the actual production machine susceptible of being used to carry out the relevant production operation. In that respect, the invention thus provides for a suitable modelization of the particular production machine (for instance of the above-described offset and intaglio printing presses) used to carry out the relevant production operation, including any variations that may affect the production accuracy, such as printing plate variations and expected geometric distortions of the substrate material during and/or following a printing operation.

In the context of the invention, it is of particular interest that the modelization of the particular line of production equipment includes a modelization of each production machine composing that line of production equipment. Considering that each particular line of production equipment may be different and exhibit a particular configuration and varying specifications, a library of modelized production machines susceptible of composing a line of production equipment is advantageously predefined so as to permit building of a modelized line of production equipment based on the predefined library of modelized production machines.

Figure 6:
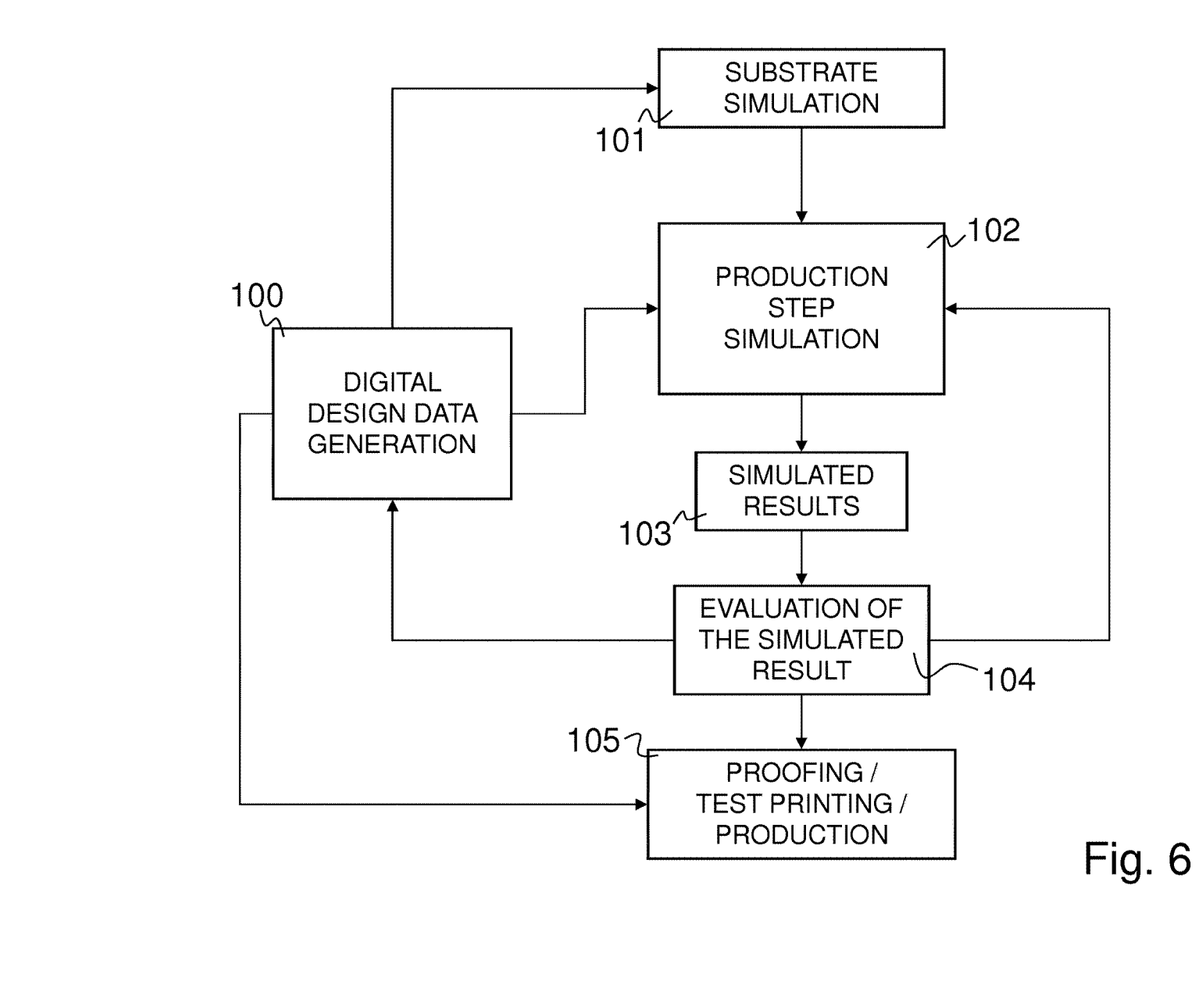
FIG. 6 is a schematic diagram illustrative of a preferred embodiment of the invention.

FIG. 6 is a schematic diagram illustrative of a preferred embodiment of the invention. Reference numeral 100 generally denotes the generation of suitable digital design data representative of the composite security design of the security document as this has already been explained. In the particular context of FIG. 6, it is assumed for the sake of illustration that such digital design data also include relevant design data pertaining to the definition of the substrate and of the features thereof (watermarks, threads, windows, etc.). It is to be understood however that the digital design data are not necessarily originating from a single source.

The digital design data generated or defined at 100 are preferably exploited for the purpose of carrying out a computer simulation of the substrate and of the relevant features thereof at 101 as well as for the purpose of carrying out a simulation of each relevant production operation at 102. In this particular instance, the basic simulation results are at least derived from the computer simulation of the substrate at 101 and from the computer simulation of any of the relevant production operations at 102, leading to the production of combined simulated results at 103.

Preferably, each relevant production operation is simulated in a step-by-step manner, i.e. by performing a computer simulation of the relevant production operations including, for each one of the simulated production operations, the generation of a corresponding series of digital representations of computer simulated results of the production operation, which series of digital representation simulates expected variations and fluctuations in the provision of the relevant set of design features. The expression "step-by-step computer simulation" should be understood as referring to a simulation of individual production operations which are of relevance for the purpose of carrying out an evaluation of the producibility of the composite security design on the line of production equipment (whether of the composite security design as a whole or of any relevant portion thereof). In that respect, assuming that one is only interested in a specific region of interest of the composite security design covering only a portion of the surface of the security document, all production operations necessary to produce the entire composite security document do not necessarily have to be simulated, but only those production operations or steps that have a direct impact on or affect the producibility of that portion of the composite security design in the relevant region of interest.

Turning back to FIG. 6, evaluation of the computer simulated results can be performed at 104, which evaluation may lead to modifications of the composite security design itself and/or to technical changes or updates to the particular line of production equipment. This process can be performed step-by-step and in an iterative may by proceeding further with the simulation of any other relevant production operation as further illustrated in FIG. 6.

Once the operator is satisfied with the evaluation of the computer simulated results, proofing, test printing and/or production of the security documents can be undertaken at 106 using the digital design data produced at 100 for the purpose of generating the necessary origination data to produce the necessary printing media for actual production.

The method of the invention can be implemented on any adequate digital computer environment comprising a computer system running the necessary software program designed to carry out the desired operations, namely:

processing of the digital design data representative of the composite security design of the security document;
  modelization of the line of production equipment by means of which the composite security design is intended to be produced; and
  running of the computer simulation of production results of the plurality of successive production operations on the basis of the digital design data and the modelized line of production equipment.

As already mentioned above, the computer simulation of the relevant production operations preferably includes, for each one of the simulated production operations, the generation of a corresponding series of digital representations of computer simulated results of the production operation, which series of digital representation simulates expected variations and fluctuations in the provision of the relevant set of design features. To this end, the software program should be suitably designed to replicate as closely as possible the said expected variations and fluctuations that occur as a result of carrying out each relevant production operation on the corresponding production machines making up the particular line of production equipment that is intended to be used to produce the composite security design. This at least necessitates a software program adapted to process computer images so as to simulate all relevant production variations (such as variations in print and/or colour register, geometric distortions, line-gain, etc.) as they would occur on each particular piece of production equipment.

Figure 7:
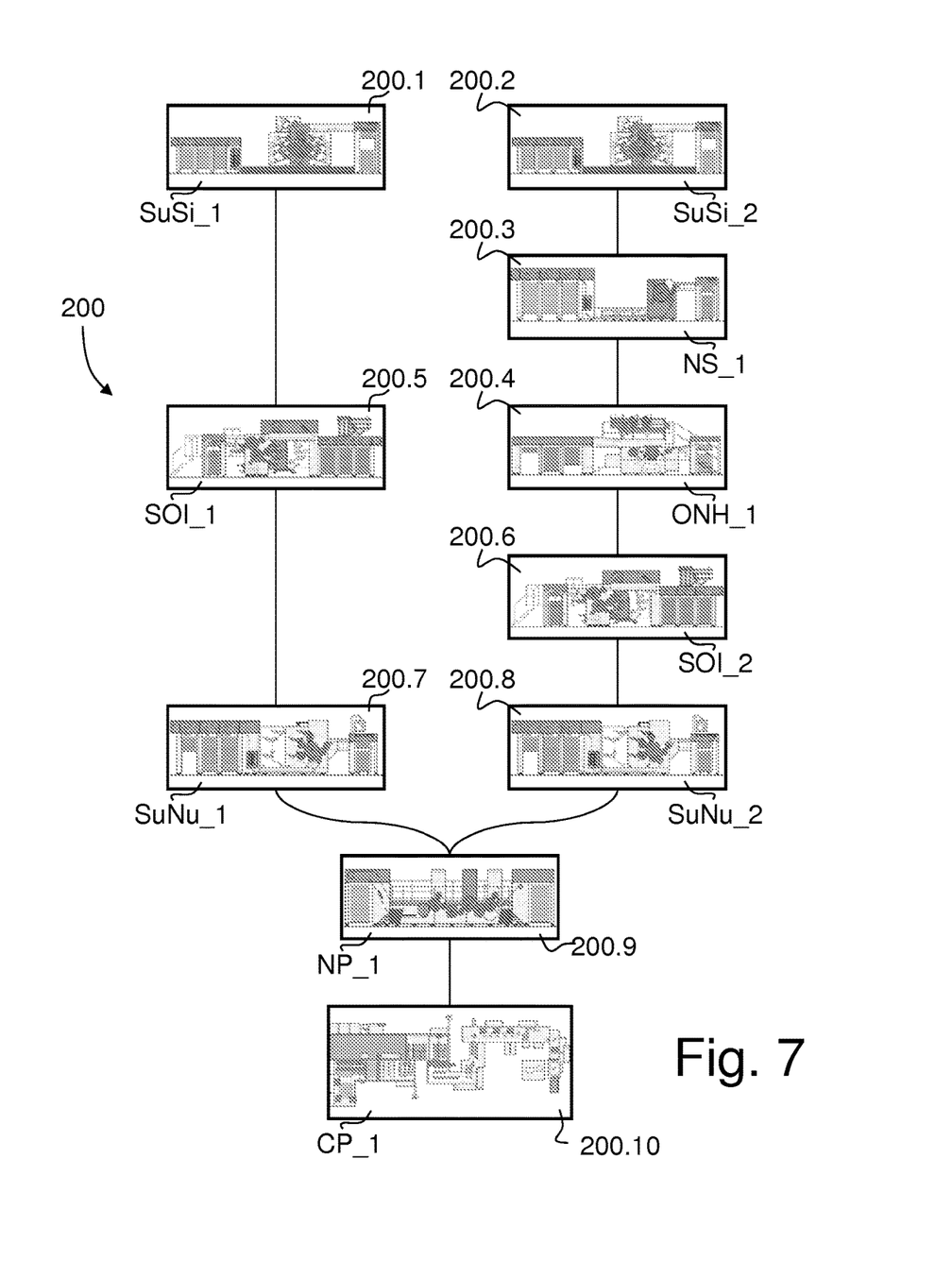
FIG. 7 is a schematic diagram illustrating a possible line of production equipment.

FIG. 7 schematically shows a purely illustrative and exemplary production facility including a plurality of distinct production machines 200.1 to 200.10 for printing and processing sheets for the production of banknotes. In FIG. 7, each production machine is given a specific machine identifier ("SuSi_1", "SuSi_2", "NS_1", etc.) for the purpose of the present discussion, namely:

production machines 200.1 and 200.2 with machine identifiers "SuSi_1" and "SuSi_2", which are sheet-fed Simultan offset printing presses of the type described in relation to FIG. 4 hereof, various configurations and options of which are for instance disclosed in Swiss Patent No. CH 502 897, European Patent Publication No. EP 0 949 069 A1 and International Publications Nos. WO 2007/042919 A2, WO 2007/105059 A1 and WO 2007/105061 A1, all assigned to the present Applicant;

production machine 200.3 with machine identifier "NS_1", which is a sheet-fed silk-screen printing press for printing iridescent and/or optically-variable ink (OVI) patterns as marketed by the instant Applicant under the product designation NotaScreen®, various configurations and options of which are for instance disclosed in European Patent Publication No. EP 0 723 864 A1 and International Publications Nos. WO 97/29912 A1, WO 97/34767 A1, WO 2004/096545 A2, WO 2005/000585 A1 and WO 2008/102303 A2, all assigned to the present Applicant;

production machine 200.4 with machine identifier "ONH_1", which is a sheet-fed hot-stamping press for the application of foil material such as optically-variable devices (OVDs), holograms and the like as marketed by the instant Applicant under the product designation OptiNota® H, various configurations and options of which are for instance disclosed in European Patent Publication No. EP 0 965 446 A1 and International Publications Nos. WO 97/35721 A1, WO 97/35794 A1, WO 97/35795 A1, WO 97/36756 A1, WO 2005/102733 A2, WO 2008/104904 A1, WO 2009/112989 A1 and WO 2010/001317 A1, all assigned to the present Applicant;

production machines 200.5 and 200.6 with machine identifiers "SOI_1" and "SOI_2", which are sheet-fed intaglio printing presses of the type described in relation to FIG. 5 hereof, various configurations and options of which are for instance disclosed in European Patent Publications Nos. EP 0 091 709 A1, EP 0 406 157 A1. EP 0 873 866 A1, EP 1 602 483 A1 and International Publications Nos. WO 03/047862 A1, WO 2004/069538 A2, WO 2004/069539 A2, WO 2004/101282 A1, WO 2005/077656 A1, WO 2005/090088 A1, WO 2005/102728 A1, WO 2005/118294 A1, WO 2007/060615 A1, WO 2007/116353 A1, WO 2011/077348 A1, WO 2011/077350 A1 and WO 2011/077351 A1, all assigned to the present Applicant;

production machines 200.7 and 200.8 with machine identifiers "SuNu_1" and "SuNu_2", which are sheet-fed letterpress printing presses for the numbering of sheets as marketed by the instant Applicant under the product designation Super Numerota®, various configurations and options of which are for instance disclosed in European Patent Publication No. EP 0 061 795 A1 and International Publications Nos. WO 03/099579 A1, WO 2005/008605 A1, WO 2005/008606 A1, WO 2005/123415 A1, WO 2006/129245 A2 and WO 2007/060624 A1, all assigned to the present Applicant;

production machine 200.9 with machine identifier "NP_1", which is a sheet-fed varnishing press for the recto-verso varnishing of printed sheets as marketed by the instant Applicant under the product designation NotaProtector®, various configurations and options of which are for instance disclosed in International Publication No. WO 2010/023598 A1, assigned to the present Applicant; and production machine 200.10 with machine identifier "CP_1", which is a sheet-fed finishing machine for processing the fully-printed sheets into individual banknote bundles and bundle packs as marketed by the instant Applicant under the product designation Cut-Pak®, various configurations and options of which are disclosed in U.S. Pat. Nos. 3,939,621, 4,045,944, 4,453,707, 4,558,557 and European Patent Publications Nos. EP 0 656 309 A1, EP 1 607 355 A1 and International Publications Nos. WO 2008/010125 A2, WO 2009/130638 A1 and WO 2011/015982 A1, all assigned to the present Applicant.

It will therefore be understood that a vast variety of production machines of different configurations and specifications, with corresponding production variations, can compose any particular line of production equipment for the production of any given composite security design. As schematically depicted in FIG. 7, a first exemplary line of production equipment may be comprised of production machines 200.1, 200.5, 200.7, 200.9, and 200.10, while a second exemplary line of production equipment may be comprised of production machines 200.2, 200.3, 200.4, 200.6, 200.8, 200.9 and 200.10, both lines sharing in this example the same production machines for carrying out the penultimate and ultimate production operations. Variations are obviously possible, bearing in mind that additional and/or alternate production equipment beyond the machines schematically illustrated in FIG. 7 could be employed in practice.

A key aspect and advantage of the present invention resides in the fact that, as long as the necessary digital image data representing the desired composite security design are provided and the corresponding line of production equipment is adequately modelized in a computer environment, the producibility of any given composite security design on that particular line of production equipment can be checked before actual production. This further achieves considerable costs savings, especially in cases where a same composite security design is intended to be produced on different lines of production equipment with their respective specifications, configurations and production variations.

Various modifications and/or improvements may be made to the above-described embodiments without departing from the scope of the invention as defined by the appended claims. For instance, the computer simulation may focus on an individual security document and/or reflect the expected production fluctuations from the perspective of an entire composite impression comprising the replication of multiple security documents.

The computer simulation may also focus, as already mentioned, on any particular region of interest of the composite security design covering only a portion of the surface of the security document. For instance, the computer simulation could be limited to a localized region covering any particular security feature or pattern that is of interest. In that context, only the relevant production operations that effectively affect the region of interest under consideration need to be simulated, it being again noted that all production operations do not necessarily affect the entire surface covered by the composite security design. For instance, assuming a region of interest focusing on a serial number printed by letterpress printing on an offset background, the computer simulation may in this case be performed only in relation to the offset printing operation and the letterpress printing operation (and possibly include a simulation of the substrate and of features thereof), even though the overall composite security design may include additional sets of design features (such a screen printed, intaglio-printed features, etc.) provided elsewhere on the composite security design.

As a further refinement of the invention, the computer simulated production results may further be exploited for the purpose of generating a reference model for inspection of the production quality of the composite security design during production. In that respect, it shall be understood that in-line and off-line inspection systems and machines are typically put in use at various stages of the production of security documents.

In yet a further refinement of the invention, the computer simulated results could further be exploited for the purpose of automatically setting up production machines of the line of production equipment.

LIST OF REFERENCES USED IN THE
FIGURES AND SPECIFICATION 5 pre-press activities
10 "blank" substrate made of a suitable substrate material, such as a paper, polymer or hybrid (e.g. polymer and paper) substrate
11 "Simultan" offset printing operation (simultaneous printing of front and back sides)
12 screen printing operation (front side)
13 intaglio printing operation (back side)
14 foil application (e.g. hot stamping) operation (front side)
15 intaglio printing operation (front side)
16 numbering (e.g. letterpress printing) operation
17 finishing (i.e. stacking, cutting, banderoling and packing) operation
21 digital design data creation
22 proofing
23 plate-making (e.g. CTP process such as CToP®, CTiP®, etc.)
24 test prints
25 production of security documents (e.g. printing and processing of individual sheets carrying multiple security prints arranged in multiple rows and columns)
30 computer simulation of the production of the composite security design
S printed sheets carrying multiple security prints arranged in multiple rows and columns
B individual security documents, such as banknotes
40 (three-segment) blanket cylinder
41 plate cylinder carrying offset printing plate (plate P1)
42 plate cylinder carrying offset printing plate (plate P2)
43 plate cylinder carrying offset printing plate (plate P3)
44 plate cylinder carrying offset printing plate (plate P4)
45 inking system with individual inking units for inking plates P1 to P4
46 mobile inking carriage with inking system 45
50 (three-segment) blanket cylinder
51 plate cylinder carrying offset printing plate (plate P5)
52 plate cylinder carrying offset printing plate (plate P6)
53 plate cylinder carrying offset printing plate (plate P7)
54 plate cylinder carrying offset printing plate (plate P8)
55 inking system with individual inking units for inking plates P5 to P8
56 mobile inking carriage with inking system 55
60 (three-segment) impression cylinder
61 (three-segment) plate cylinder (carrying three intaglio printing plates IP1, IP2, IP3)
62 (two-segment) ink-collecting, or "Orlof", cylinder
65 wiping cylinder for wiping excess ink from the surface of the intaglio printing plates IP1, IP2, IP3
71 chablon cylinder carrying chablon plate (chablon plate CP1)
72 chablon cylinder carrying chablon plate (chablon plate CP2)
73 chablon cylinder carrying chablon plate (chablon plate CP3)
74 chablon cylinder carrying chablon plate (chablon plate CP4)
75 inking system with individual inking units for inking chablon plates CP1 to CP4
76 mobile inking carriage with inking system 75
100 digital design data creation
101 computer simulation of substrate (and of features thereof)
102 (step-by-step) computer simulation of the production operations
103 computer simulated production results of the production operations
104 evaluation of the computer simulated production results
105 proofing, test printing and production of security documents
200 line of production equipment
200.1 Super Simultan® offset printing press ("SuSi_1")
200.2 Super Simultan® offset printing press ("SuSi_2")
200.3 NotaScreen® screen printing press ("NS_1")
200.4 OptiNota® H hot-stamping press ("ONH_1")
200.5 Super Orlof Intaglio® intaglio printing press ("SOI_1")
200.6 Super Orlof Intaglio® intaglio printing press ("SOI_2")
200.7 Super Numerota® numbering (letterpress printing) press ("SuNu_1")
200.8 Super Numerota® numbering (letterpress printing) press ("SuNu_2")
200.9 NotaProtector® varnishing press ("NP_1")
200.10 CutPak® finishing system ("CP_1")

The invention claimed is:
1. A method of checking producibility of a composite security design of a security document, in particular of a composite banknote design, on a line of production equipment, the composite security design being the product of a combination of multiple sets of design features that are to be provided on a substrate as a result of a plurality of successive production operations carried out by means of the line of production equipment, the method comprising the steps of:
a) providing digital design data representative of the composite security design of the security document;
b) modelizing, in a computer environment, the line of production equipment by means of which the composite security design is intended to be produced;
c) performing a computer simulation of production results of the plurality of successive production operations on the basis of the digital design data and the modelized line of production equipment;
d) evaluating the computer simulated production results and determining, on the basis of these computer simulated production results, whether the composite security design can be produced on the line of production equipment,
e) exploiting the computer simulated production results to generate a reference model for inspection of the production quality of the composite security design during production,
further comprising the step of predefining a library of modelized production machines susceptible of composing a line of production equipment and wherein step b) includes building a modelized line of production equipment based on the said library,
wherein the plurality of successive production operations at least include an offset printing operation and an intaglio printing operation,
wherein the plurality of successive production operations further include a screen printing operation and/or a typographic printing operation,
wherein step b) includes a modelization of each relevant production machine composing the line of production equipment,
wherein step c) includes performing a computer simulation of the substrate and of features thereof, as well as of expected geometric distortions of the substrate occurring during production, and
wherein step c) includes performing a computer simulation of production results under the following simulated viewing or reading conditions:
  reflected visible light involving a simulation of a visible optical appearance of the composite security design as observable under reflected visible light from one side of the security document;
  transmissive visible light involving a simulation of a visible optical appearance of the composite security design as observable in transmission through the security document;
  invisible illumination involving a simulation of a visible optical appearance of the composite security design as observable when illuminated by invisible or near-visible light, such as ultraviolet or infrared light; or
  machine-reading involving a simulation of a machine-readable appearance of the composite security design as detectable by a machine when subjected to a machine detection technique, such as a magnetic reading or detection in the invisible light spectrum.

2. The method according to claim 1, further comprising the step of editing the digital design data, on the basis of the computer simulated production results, to match a production capability of the line of production equipment.

3. The method according to claim 1, further comprising the step of identifying a production machine, or a component thereof, within the line of production equipment that prevents or otherwise affects the ability of the line of production equipment to produce the composite security design.

4. The method according to claim 1, wherein the digital design data representative of the composite security design of the security document include multiple digital design data sets each representing a corresponding one of the multiple sets of design features forming the composite security design,
and wherein step c) includes a step-by-step computer simulation of the successive production operations including, for each one of the plurality of successive production operations, the generation of a corresponding series of digital representations of computer simulated production results of the production operation, which series of digital representations simulates expected variations and fluctuations in the provision of the relevant set of design features.

5. The method according to claim 4, wherein the security document is produced in the form of a printed substrate carrying a composite impression consisting of the replication of the composite security design of the security document according to an array of multiple rows and columns,
and wherein step c) includes the generation of a series of digital representations of computer simulated production results of the whole composite impression, which series of digital representations simulates expected variations and fluctuations in the provision of the relevant set of design features over the entire area of the composite impression.

6. The method according to claim 5, wherein step c) further includes performing a computer simulation of control marks provided in margin portions of the printed substrate, such a print-to-print register marks indicative of a register between successive impressions, plate-to-plate register marks indicative of a register between different printing plates, or cutting marks indicative of positions at which the printed substrate is to be cut during a finishing operation.

7. The method according to claim 1, wherein step c) includes performing a computer simulation of the production results within a least one region of interest of the composite security design covering only a portion of the surface of the security document.

8. The method according to claim 1, wherein the plurality of successive production operations further include processing operations, in particular foil application, marking, perforation and cutting operations.

9. The method according to claim 1, wherein the plurality of successive production operations further include finishing operations whereby fully-printed substrates carrying multiple security prints are cut and processed into individual security documents.

10. A digital computer environment comprising a computer system having a hardware processor and running a software program designed to allow an operator to check the producibility of a composite security design of a security document, in particular of a composite banknote design, on a line of production equipment, the composite security design being the product of a combination of multiple sets of design features that are to be provided on a substrate as a result of a plurality of successive production operations carried out by means of the line of production equipment, the software program carries out the following operations:
a) processing digital design data representative of the composite security design of the security document;

b) modelizing the line of production equipment by means of which the composite security design is intended to be produced;
c) performing a computer simulation of production results of the plurality of successive production operations on the basis of the digital design data and the modelized line of production equipment;
d) evaluating the computer simulated production results and determining, on the basis of these computer simulated production results, whether the composite security design can be produced on the line of production equipment,
e) exploiting the computer simulated production results to generate a reference model for inspection of the production quality of the composite security design during production,
further comprising the step of predefining a library of modelized production machines susceptible of composing a line of production equipment and wherein step b) includes building a modelized line of production equipment based on the said library,
wherein the plurality of successive production operations at least include an offset printing operation and an intaglio printing operation,
wherein the plurality of successive production operations further include a screen printing operation and/or a typographic printing operation,
wherein step b) includes a modelization of each relevant production machine composing the line of production equipment,
wherein step c) includes performing a computer simulation of the substrate and of features thereof, as well as of expected geometric distortions of the substrate occurring during production, and
wherein step c) includes performing a computer simulation of production results under the following simulated viewing or reading conditions:
  reflected visible light involving a simulation of a visible optical appearance of the composite security design as observable under reflected visible light from one side of the security document;
  transmissive visible light involving a simulation of a visible optical appearance of the composite security design as observable in transmission through the security document;
  invisible illumination involving a simulation of a visible optical appearance of the composite security design as observable when illuminated by invisible or near-visible light, such as ultraviolet or infrared light; or
  machine-reading involving a simulation of a machine-readable appearance of the composite security design as detectable by a machine when subjected to a machine detection technique, such as a magnetic reading or detection in the invisible light spectrum.

11. The digital computer environment according to claim 10, wherein said software program is further designed to allow edition of the digital design data, on the basis of the computer simulated production results, to match a production capability of the line of production equipment.

12. The digital computer environment according to claim 10, wherein said software program is further designed to allow identification of a production machine, or a component thereof, within the line of production equipment that prevents or otherwise affects the ability of the line of production equipment to produce the composite security design.

13. The digital computer environment according to claim 10, wherein the digital design data representative of the composite security design of the security document include multiple digital design data sets each representing a corresponding one of the multiple sets of design features forming the composite security design,
and wherein the computer simulation includes running a step-by-step computer simulation of the successive production operations including, for each one of the plurality of successive production operations, the generation of a corresponding series of digital representations of computer simulated production results of the production operation, which series of digital representations simulates expected variations and fluctuations in the provision of the relevant set of design features.

14. The digital computer environment according to claim 10, wherein the computer simulation includes running a computer simulation of the production results within a least one region of interest of the composite security design covering only a portion of the surface of the security document.

* * * * *